US008884656B2

(12) United States Patent
Braunshtein

(10) Patent No.: US 8,884,656 B2
(45) Date of Patent: Nov. 11, 2014

(54) HIGH-PERFORMANCE ZERO-CROSSING DETECTOR

(71) Applicant: Sigma Designs Israel S.D.I Ltd., Tel Aviv (IL)

(72) Inventor: Danny Braunshtein, Kohav Yair (IL)

(73) Assignee: Sigma Designs Israel S.D.I. Ltd., Tel Aviv (IL)

( * ) Notice: Subject to any disclaimer, the term of this patent is extended or adjusted under 35 U.S.C. 154(b) by 0 days.

(21) Appl. No.: 14/061,830

(22) Filed: Oct. 24, 2013

(65) Prior Publication Data

US 2014/0118028 A1 May 1, 2014

Related U.S. Application Data

(60) Provisional application No. 61/720,437, filed on Oct. 31, 2012, provisional application No. 61/747,378, filed on Dec. 31, 2012.

(51) Int. Cl.
*H03K 5/1536* (2006.01)
*G01R 19/175* (2006.01)

(52) U.S. Cl.
CPC ............ *G01R 19/175* (2013.01); *H03K 5/1536* (2013.01)
USPC ................. 327/79; 327/63; 330/268; 330/274

(58) Field of Classification Search
CPC .............................. H03K 5/153; H03K 5/1536
USPC ........... 327/63, 51, 52, 54, 57, 60, 65, 67, 68, 327/69, 70, 78, 79, 90; 330/267, 268, 273, 330/274, 285, 296, 297, 114, 123, 127, 134, 330/135, 138
See application file for complete search history.

(56) References Cited

U.S. PATENT DOCUMENTS 4,169,982 A 10/1979 Rittmann
4,417,164 A 11/1983 Edlund
(Continued)

FOREIGN PATENT DOCUMENTS

DE 102010012529 B3 6/2011
WO 2010118495 A2 10/2010

OTHER PUBLICATIONS

European Application # 13190619.0 Search Report dated Jun. 6, 2014.

*Primary Examiner* — Lincoln Donovan
*Assistant Examiner* — Jung H Kim
(74) *Attorney, Agent, or Firm* — D. Kliger I.P. Services Ltd.

(57) ABSTRACT

A zero-crossing detection circuit includes a comparator and circuitry. The comparator produces an output signal that is indicative of zero-crossing events in an input Alternating Current (AC) waveform. The circuitry may be configured to feed the comparator with first and second rails voltages, and to progressively increase the rails voltages during time intervals derived from the input AC waveform, so as to feed the comparator with target values of the rails voltages in time-proximity to the zero-crossing events. The circuitry may be configured to compensate for an error in detecting the zero crossing events caused by differences in amplitude of the input AC waveform, by correcting the input AC waveform provided to the comparator. The circuitry may be configured to activate the comparator during time intervals preceding respective anticipated times of the zero-crossing events, and to deactivate the comparator at least once during time periods other than the time intervals.

12 Claims, 10 Drawing Sheets

(56) References Cited

U.S. PATENT DOCUMENTS

| | | | |
|---|---|---|---|
| 4,825,349 A | 4/1989 | Marcel | |
| 7,796,370 B1 * | 9/2010 | Wruble | 361/212 |
| 2008/0157822 A1 | 7/2008 | Kuo | |
| 2008/0309379 A1 | 12/2008 | Carroll | |
| 2011/0279163 A1 * | 11/2011 | Barnett et al. | 327/324 |

* cited by examiner

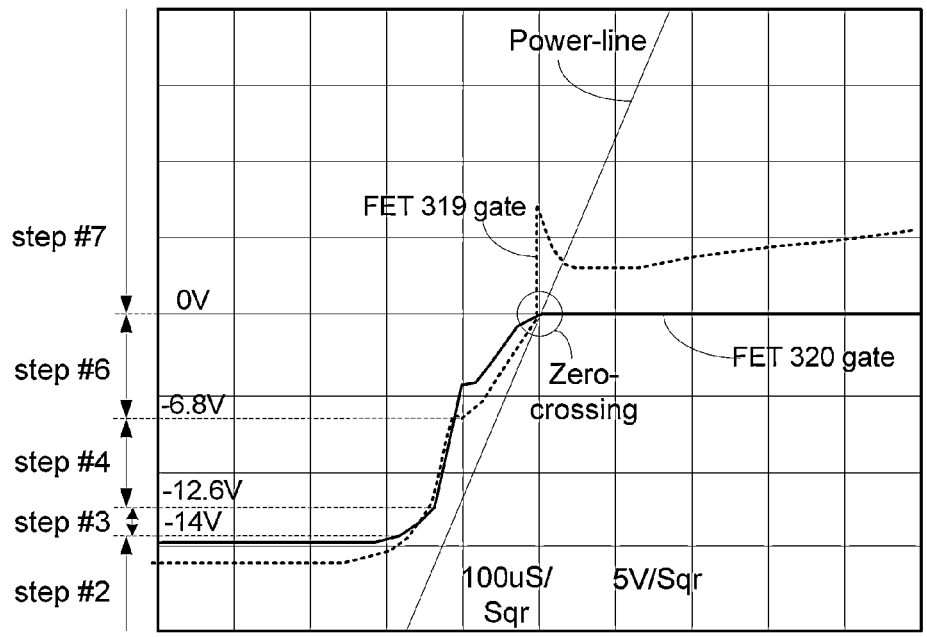
FIG. 10
FIG. 11
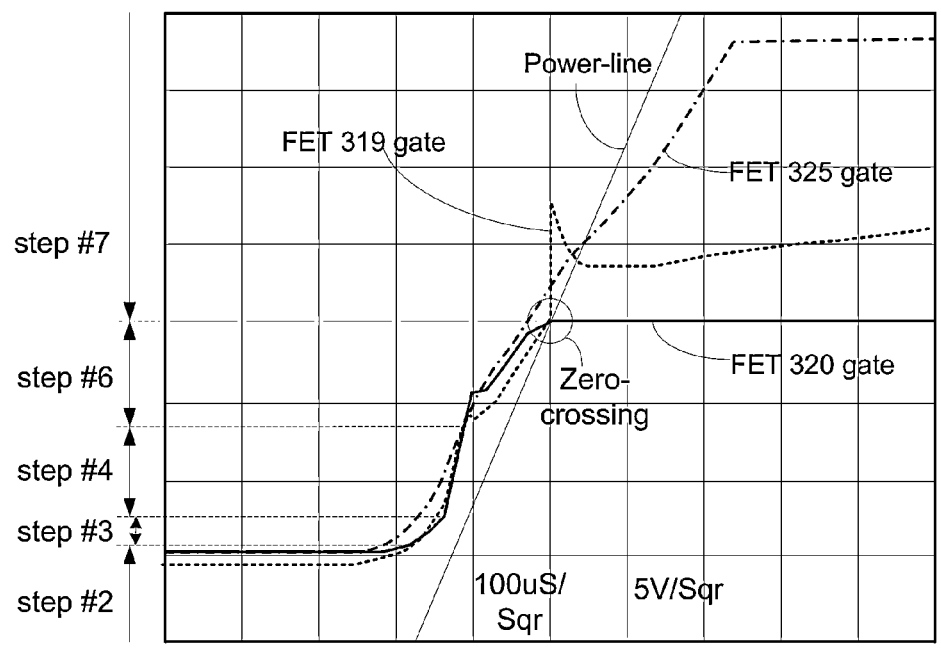

US 8,884,656 B2

HIGH-PERFORMANCE ZERO-CROSSING DETECTOR

CROSS-REFERENCE TO RELATED APPLICATIONS

This application claims the benefit of U.S. Provisional Patent Application 61/720,437, filed Oct. 31, 2012, and U.S. Provisional Patent Application 61/747,378, filed Dec. 31, 2012, whose disclosures are incorporated herein by reference.

FIELD OF THE INVENTION

The present invention relates generally to electronic circuits, and particularly to methods and devices for zero-crossing detection.

BACKGROUND OF THE INVENTION

Detecting the zero-crossing points of Alternating Current (AC) waveforms is useful in a variety of applications, such as AC motor control, microprocessor-based dimmers and Power-Line Communication (PLC). Various techniques and circuit designs for zero-crossing detection are known in the art.

For example, U.S. Patent Application Publication 2008/0157822 describes a zero-crossing point detection circuit that includes a hot line input, a neutral line input, a first zero-crossing point output and a first optical coupler. The first optical coupler includes a first light-emitting diode (LED) and a first optical transistor. The hot line input and neutral line input are respectively connected to two terminals of the first LED. An emitter of the first optical transistor is grounded. A collector of the first optical transistor is connected to a direct current (DC) power source. The collector of the first optical transistor is also connected to the first zero-crossing point output.

As another example, U.S. Patent Application Publication 2011/0279163 describes a signal level crossing detector circuit that includes a DC isolator and a detector circuit. The DC isolator has at least a first input, which is operable to receive a high voltage AC signal, and at least a first capacitor, a first plate of the first capacitor being electrically connected to the first input. The detector circuit is operable at a low voltage and has at least a first detector input, the first detector input being electrically connected to a second plate of the first capacitor, the low voltage detector circuit being operable to provide a change in output signal in dependence on a high voltage AC signal on the first input crossing a predetermined signal level. The signal level crossing detector may be single ended or differential.

U.S. Patent Application Publication 2008/0309379 describes a zero crossing circuit that includes a signal output circuit element for registering a sharply defined signal, and in one embodiment an isolation circuit element cooperating with the signal output element, and a delay-inducing circuit element cooperating with the signal output element for applying a substantially constant time delay to the signal. The delay-inducing element includes a switch circuit and a delay circuit. The switch circuit commences the time delay by the delay circuit upon a triggering voltage being reached. The time delay circuit is adapted so that the time delay equates to a time period required for the triggering voltage to change to zero so as to cross zero voltage substantially as the time delay expires.

The description above is presented as a general overview of related art in this field and should not be construed as an admission that any of the information it contains constitutes prior art against the present patent application.

SUMMARY OF THE INVENTION

An embodiment that is described herein provides a zero-crossing detection circuit including a comparator and circuitry. The comparator is configured to produce an output signal that is indicative of zero-crossing events in an input Alternating Current (AC) waveform. The circuitry is configured to feed the comparator with first and second rails voltages, and to progressively increase the rails voltages during time intervals that are derived from the input AC waveform, so as to feed the comparator with target values of the rails voltages in time-proximity to the zero-crossing events.

In some embodiments, the circuitry includes a short-term power supply for producing the rails voltages, and a control circuit that is configured to charge the short-term power source during time periods that precede the respective time intervals, and to cause the short-term power supply to increase the rails voltages during the time intervals. In an embodiment, the circuitry is configured to consume energy from the short-term power supply following the zero-crossing events.

In a disclosed embodiment, the circuitry is configured to apply the progressively-increased rails voltages to the comparator only in a predefined time proximity to the zero-crossing events, and to remove one or more of the rails voltages from the comparator outside the predefined time proximity. In another embodiment, the circuitry includes a compensation circuit, which is configured to compensate for timing errors in detecting the zero crossing events caused by differences in amplitude of the input AC waveform, by correcting the input AC waveform provided to the comparator.

In yet another embodiment, the circuitry includes a limiter for protecting the comparator from amplitudes of the input AC waveform. In still another embodiment, the circuitry includes a latched opto-coupler, and the comparator is configured to drive the latched opto-coupler with the output signal so as to indicate the zero-crossing events.

There is additionally provided, in accordance with an embodiment of the present invention, a zero-crossing detection circuit including a comparator and circuitry. The comparator is configured to produce an output signal that is indicative of zero-crossing events in an input Alternating Current (AC) waveform. The circuitry is configured to compensate for an error in detecting the zero crossing events caused by differences in amplitude of the input AC waveform, by correcting the input AC waveform provided to the comparator.

In some embodiments, the circuitry is configured to correct the input AC waveform provided to the comparator by adding to the input AC waveform a compensation voltage that is proportional to the amplitude of the input AC waveform. In an example embodiment, the circuitry is configured to charge a capacitor over a negative half-cycle of the input AC waveform, and to supply the compensation voltage from the charged capacitor.

In another embodiment, the circuitry is configured to feed the comparator with first and second rails voltages, and to progressively increase the rails voltages during time intervals that are derived from the input AC waveform, so as to feed the comparator with target values of the rails voltages in time-proximity to the zero-crossing events. In an embodiment, the circuitry is configured to activate the comparator only during predefined time intervals that precede respective anticipated times of the zero-crossing events.

In a disclosed embodiment, the circuitry includes a limiter for protecting the comparator from amplitudes of the input AC waveform. In an embodiment, the circuitry includes a latched opto-coupler, and the comparator is configured to drive the latched opto-coupler with the output signal so as to indicate the zero-crossing events.

There is further provided, in accordance with an embodiment of the present invention, a zero-crossing detection circuit including a comparator and circuitry. The comparator is configured to produce an output signal that is indicative of zero-crossing events in an input Alternating Current (AC) waveform. The circuitry is configured to activate the comparator during time intervals that precede respective anticipated times of the zero-crossing events, and to deactivate the comparator at least once during time periods other than the time intervals.

In some embodiments, the circuitry is configured to feed the comparator with first and second rails voltages, to apply both of the rails voltages to the comparator during the time intervals and to remove one or both of the rails voltages from the comparator at least once during the time periods other than the time intervals. In an embodiment, the circuitry is configured to feed the comparator with first and second rails voltages, and to progressively increase the rails voltages during time periods that are derived from the input AC waveform, so as to feed the comparator with target values of the rails voltages in time-proximity to the zero-crossing events.

In another embodiment, the circuitry includes a compensation circuit, which is configured to compensate for timing errors in detecting the zero crossing events caused by differences in amplitude of the input AC waveform, by correcting the input AC waveform provided to the comparator. In yet another embodiment, the circuitry includes a limiter for protecting the comparator from amplitudes of the input AC waveform. In a disclosed embodiment, the circuitry includes a latched opto-coupler, and the comparator is configured to drive the latched opto-coupler with the output signal so as to indicate the zero-crossing events.

There is also provided, in accordance with an embodiment of the present invention, a method for zero-crossing detection. A comparator is operated to produce an output signal that is indicative of zero-crossing events in an input Alternating Current (AC) waveform. The comparator is fed with first and second rails voltages. The rails voltages are progressively increased during time intervals that are derived from the input AC waveform, so as to feed the comparator with target values of the rails voltages in time-proximity to the zero-crossing events.

There is further provided, in accordance with an embodiment of the present invention, a method for zero-crossing detection. A comparator is operated to produce an output signal that is indicative of zero-crossing events in an input Alternating Current (AC) waveform. Timing errors in detecting the zero crossing events, caused by differences in amplitude of the input AC waveform, are compensated for by correcting the input AC waveform provided to the comparator.

There is additionally provided, in accordance with an embodiment of the present invention, a method for zero-crossing detection. A comparator is operated to produce an output signal that is indicative of zero-crossing events in an input Alternating Current (AC) waveform. The comparator is activated during time intervals that precede respective anticipated times of the zero-crossing events, and deactivated at least once during time periods other than the time intervals.

There is also provided, in accordance with an embodiment of the present invention, a modem including a zero-crossing detector and communication circuitry. The zero-crossing detector includes a comparator and circuitry. The comparator is configured to produce an output signal that is indicative of zero-crossing events in an input Alternating Current (AC) waveform provided on a power-line network. The circuitry is configured to feed the comparator with first and second rails voltages, and to progressively increase the rails voltages during time intervals that are derived from the input AC waveform, so as to feed the comparator with target values of the rails voltages in time-proximity to the zero-crossing events. The communication circuitry is configured to exchange communication signals with a remote modem over the power-line network, to receive the output signal from the zero-crossing detector, and to synchronize the communication signals using the zero-crossing events indicated by the output signal.

The present invention will be more fully understood from the following detailed description of the embodiments thereof, taken together with the drawings in which:

BRIEF DESCRIPTION OF THE DRAWINGS

FIGS. 10 and 11 are graphs showing step-by-step performance of a zero-crossing detector, in accordance with an embodiment of the present invention.

DETAILED DESCRIPTION OF EMBODIMENTS

Overview

Figure 1:
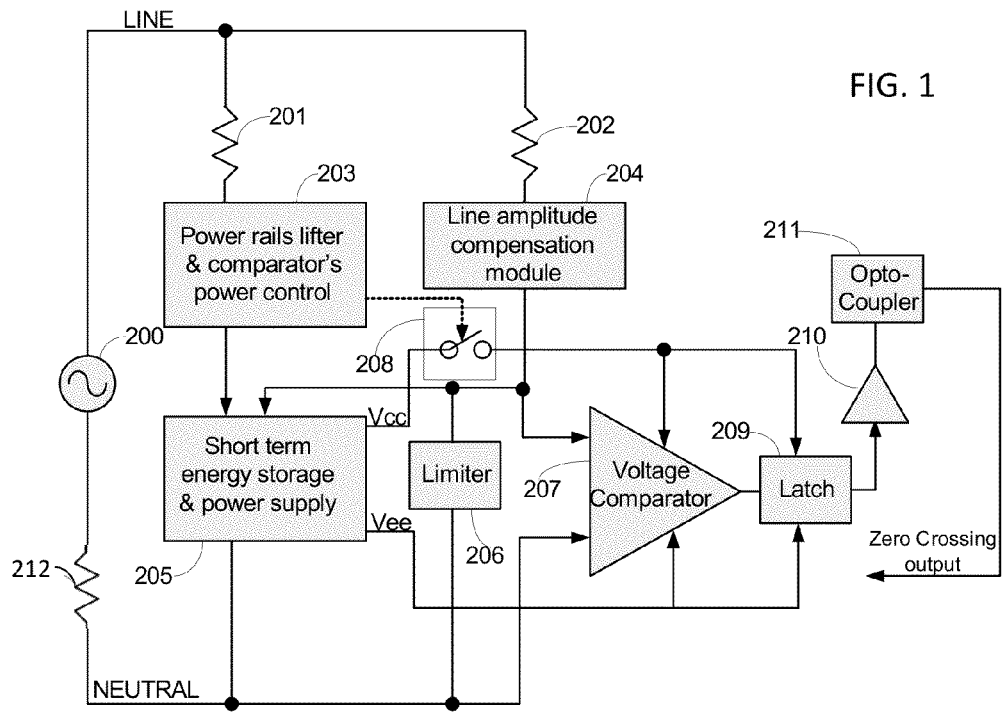
FIG. 1 is a block diagram that schematically illustrates a zero-crossing detector, in accordance with an embodiment of the present invention.

Embodiments of the present invention that are described herein provide improved methods and devices for detecting the zero-crossing points of Alternating Current (AC) waveforms. In the context of the present patent application and in the claims, the term "zero-crossing points" refers to the points in time in which the waveform turns from positive to negative or vice versa, i.e., the points in time in which the voltage of the input AC waveform equals zero.

The embodiments described herein refer mainly to Power Line Communication (PLC) applications, although the disclosed techniques can be used in any other suitable application. In the PLC implementations described herein, the input AC waveform comprises a substantially sinusoidal mains line voltage provided on a pair of lines denoted NEUTRAL and LINE.

In some embodiments, a zero-crossing detector comprises a comparator, such as a differential amplifier, which receives the differential AC waveform as input and produces an output signal that is indicative of the zero-crossing points of the waveform. Typically although not necessarily, the comparator detects only half of the zero-crossing points, in which the AC waveform turns from negative to positive. In an embodiment, the output signal is provided to a latch that drives an opto-coupler. This sort of output circuitry provides a zero-crossing detection signal that is galvanically isolated from the AC voltage.

In some embodiments, the zero-crossing detector comprises circuitry that feeds the comparator with a pair of rails voltages denoted Vcc and Vee. In order to detect the zero-crossing points properly, the rails voltages should be set to predefined target values. In an embodiment, the circuitry carries out a sequence of steps that gradually increases the rails voltages over a short time interval that precedes the expected zero-crossing point, so as to reach the predefined target values shortly before the anticipated zero-crossing point.

In an embodiment, the rails voltages are increased by a short-term power supply that is charged with energy from the AC waveform during the negative half-cycle that precedes the zero-crossing point. By applying the rails voltages to the comparator only a short time prior to each expected zero-crossing point, power consumption is reduced considerably.

In some embodiments, the zero-crossing detector comprises circuitry that compensates for variations in the amplitude of the input AC waveform. Such variations may occur, for example, when applying the detector to different classes of line voltages (e.g., 100/110 VAC and 220/240 VAC), or due to the finite amplitude tolerance (e.g., ±10%) of the mains network. Unless compensated for, such variations cause delay variations in the detected zero-crossing points because of the capacitance at the comparator input.

In some embodiments, the zero-crossing detector circuitry adds a compensation voltage to the AC waveform provided to the comparator. The compensation voltage is proportional to the amplitude of the input AC waveform, and thus compensates for the delay variations. This sort of compensation makes the zero-crossing detection substantially independent of the amplitude of the AC waveform. The same detector can therefore be used across different AC voltage ranges, as well as in the presence of any other source of amplitude variations.

In some embodiments, the zero-crossing detector circuitry activates the comparator only a short time period (e.g., 100-200 µS) before each anticipated zero-crossing point. In an example embodiment, the circuitry applies the Vcc and Vee rails voltages to the comparator only shortly before each anticipated zero-crossing point, and removes one or both of the rails voltages outside these periods. As a result, power consumption is reduced considerably.

Although the embodiments described herein refer mainly to activation of the comparator only in time proximity to the zero-crossing points, the disclosed techniques are not limited to such implementations. Although the comparator should be active in time proximity to the anticipated zero-crossing points, and it is generally desirable to deactivate the comparator at other times, in some embodiments the comparator may remain active at some additional times that are not necessarily in time proximity to the zero-crossing points.

In summary, the detector configurations described herein achieve highly accurate zero-crossing detection over a wide range of AC voltages. High-accuracy detection is important, for example, in PLC applications that often use the zero-crossing timing as a reference for modem synchronization. Moreover, the disclosed detectors are highly efficient in terms of power consumption. As will be shown below, the circuit designs described herein can be manufactured with low cost and small size and footprint, for example because of small component count and the fact that single components perform multiple functions.

Several examples of circuit designs that implement the disclosed techniques are described in detail below, along with signal diagrams that demonstrate the detector operation. Although some of the disclosed embodiments comprise all the above-described features (rails lifting, amplitude variation compensation and selective comparator activation), alternative embodiments may comprise only selected subsets of these features.

System-Level and Main Element Description

FIG. 1 is a block diagram that schematically illustrates a zero-crossing detector, in accordance with an embodiment of the present invention. The detector detects the zero-crossing points of an input AC waveform, in the present example a mains voltage 200 provided on a pair of lines denoted NEUTRAL and LINE.

The detector comprises a comparator 207, e.g., a differential amplifier, which receives the AC waveform as input. Comparator 207 detects the negative-to-positive zero-crossing points of AC voltage 200, and produces an output signal that is indicative of the detected zero-crossing points. The output signal drives a latch 209, which in turn drives an opto-coupler 211 via a driver 210. For each zero-crossing event, the opto-coupler produces a narrow pulse (denoted "zero crossing output" in the figure) whose leading edge indicates the detected zero-crossing point.

In addition to the comparator and output circuit, the detector of FIG. 1 comprises circuitry that carries out the disclosed techniques. The circuitry comprises resistors 201, 202 and 212, a power rails lifter and comparator power control module 203 (referred to as power rails lifter for brevity), a short-term energy storage and power supply 205 (referred to as short-term power supply for brevity), a switch 208, a line amplitude compensation module 204 and a limiter 206. Detailed circuit diagrams that implement this block diagram, or subsets thereof, are shown in FIGS. 3-9 below.

In an embodiment, short-term power supply 205 comprises a single capacitor, which stores a limited amount of energy that is sufficient for driving the internal Light-Emitting Diode (LED) of opto-coupler 211 for approximately 50-100 µS after the zero-crossing is detected. The voltages on the two terminals of this single capacitor (denoted 307 in FIG. 3 below) are Vcc and Vee. After driving the opto-coupler, the energy stored in power supply 205 is fully consumed.

In an embodiment, rails voltages Vcc and Vee provide positive and negative voltages with respect to the NEUTRAL line only during a short time interval starting shortly before and ending shortly after each zero-crossing event. During most of the negative half-cycle of voltage 200, both Vcc and Vee are negative. During most of the positive half-cycle of voltage 200, both Vcc and Vee are near zero.

Power rails lifter 203 controls the power supply portion of module 205, as well as activation of comparator 207 shortly before the anticipated zero crossing event using switch 208. During most of the negative half-cycle, the capacitor in short-term power supply 205 is charged. During this period, Vcc is −0.6V and Vee gradually moves towards −16V. (All voltage values are given herein purely by way of example. Any other suitable voltages can be used in alternative embodiments.)

Prior to the activation of comparator 207 by power rails lifter 203, the rails voltages Vcc and Vee, with respect to NEUTRAL, are approximately −0.6V and −16V, respectively. Shortly before the zero crossing event, power rails lifter 203 gradually increases power rails Vcc and Vee by 8.8V, such that Vcc becomes +8.2V and Vee becomes −7.2V. Following the power rails lifting operation, comparator 207 is activated by lifter 203 using switch 208, and therefore consumes a small part of the energy stored in short-term power supply 205. Since the amount of energy stored in the short-term power supply is limited, it is important to consume this energy only when needed.

Compensation module 204 compensates for undesirable delays in the AC waveform applied to comparator 207, caused by variations in the amplitude of voltage 200. Without compensation module 204, the voltage at the comparator input would have lagged behind the input AC waveform (voltage 200) due to the input capacitance of comparator 207. Typically, compensation module 204 generates an additive compensation voltage that overcomes the effect of the input capacitance. The additive compensation voltage changes dynamically in response to variations in the amplitude of voltage 200.

The voltage at the output of compensation module 204 drives the input of comparator 207. Because of the additive compensation voltage, in the vicinity of the zero-crossing point of voltage 200 the voltage at the output of module 204 is substantially the same as the instantaneous value of voltage 200.

In an example embodiment, resistor 202 is connected in series with compensation module 204. During most of the negative half-cycle, resistor 202 is used for providing charging current for short-term power supply 205. At the end of the negative half cycle, while voltage 200 is still negative but approaching zero, the charging current stops flowing through resistor 202 and there is therefore little or no voltage drop across the resistor. Thus, ideally, the voltage on both terminals of resistor 202 should be the same. In other words, the instantaneous value of voltage 200 should be observable on both terminals of resistor 202.

In practice, however, comparator 207 usually exhibits some parasitic capacitance at its inputs. This capacitance leads to some undesirable charging and discharging current through resistor 202. Without compensation by module 204, the parasitic capacitance would typically lead to inaccurate zero-crossing detections, since the instantaneous voltage at the input of comparator 207 would differ from voltage 200.

Compensation module 204 is placed in series with resistor 202, such that the voltage provided to the input of comparator 207 is the sum of the voltage at the bottom terminal of resistor 202 and a dynamically-generated compensation voltage, produced by module 204. When ideally compensated, the instantaneous voltage applied at the comparator input is the same as voltage 200. (This relation typically holds for low voltages, i.e., in proximity to the zero-crossing point. For larger voltages, the voltage at the comparator input is limited by limiter 206 in order to prevent damage. Limiter 206 typically comprises Zener diodes that limit the comparator input voltage to safe values.)

It can be shown that (without compensation, in the vicinity of the zero-crossing point) the difference between the instantaneous value of voltage 200 and the instantaneous voltage at the input of comparator 207 is proportional to the amplitude of voltage 200, as well as to the slew rate of voltage 200. Since the latency between voltage 200 and the comparator input is directly proportional to the slew rate of voltage 200, it follows that the latency is directly proportional to the amplitude of voltage 200.

Using the above relation, in some embodiments compensation module 204 comprises a capacitor that is charged to a voltage that is proportional to the amplitude of voltage 200 with the appropriate proportionality coefficient, and thus provides the appropriate additive compensation voltage. The capacitor is then allowed to discharge in order to prepare for the next compensation cycle. Typically, module 204 charges the capacitor over the entire negative half-cycle of voltage 200, thereby reaching the desired voltage across the capacitor.

To summarize the above description, at the zero-crossing point in time, the environmental requirements of the comparator are met so as to detect the zero-crossing point: Vee and Vcc are applied properly, the comparator is enabled by switch 208, and its reference is set to zero (i.e., substantially tied to neutral). When comparator 207 indicates a zero-crossing, the output signal produced by the comparator latches latch 209. Consequently, driver 210 drives the LED within opto-coupler 211, so as to indicate a zero-crossing event. The current driving opto-coupler 211 consumes the energy stored in short-term power supply entirely, typically within several tens of microseconds.

As noted above, zero-crossing detections are provided only for the negative-to-positive zero-crossings. During the positive half-cycle of voltage 200 following the detected zero-crossing, the compensating voltage of compensation module 204 is cleared, and limiter 206 limits the voltage at the comparators input to prevent damage. During the negative half-cycle of voltage 200, the compensation voltage rebuilds inside the compensation module. When the instantaneous value of voltage 200 is negative but approaching zero, the compensated voltage is applied to the comparator input, and the above-described process is repeated.

In some embodiments, resistor 212 helps to isolate the zero-crossing detector from AC mains 200 on the NEUTRAL line, e.g., to prevent noise injection to the AC mains. Isolation on the LINE line is facilitated by resistors 201 and 202. In an example embodiment, resistors 201, 202 and 212 have resistances of 1 MΩ, 2.2 MΩ and 100 KΩ, respectively. Alternatively, however, any other suitable values can be used. This noise is typically caused by the sharp current step that carries a relatively high current, which is desirable for reducing the opto-coupler response time. (The operation of this sharp current step is further explained in details in section "Implementation of driver 210") below.

The zero-crossing detector configurations shown in FIG. 1 and in FIGS. 3-9 below are example configurations, which are chosen purely for the sake of conceptual clarity. In alternative embodiments, any other suitable detector configurations can be used. The elements of the zero-crossing detector may be implemented, for example, using discrete components, in an Application-Specific Integrated Circuit (ASIC).

Figure 2:
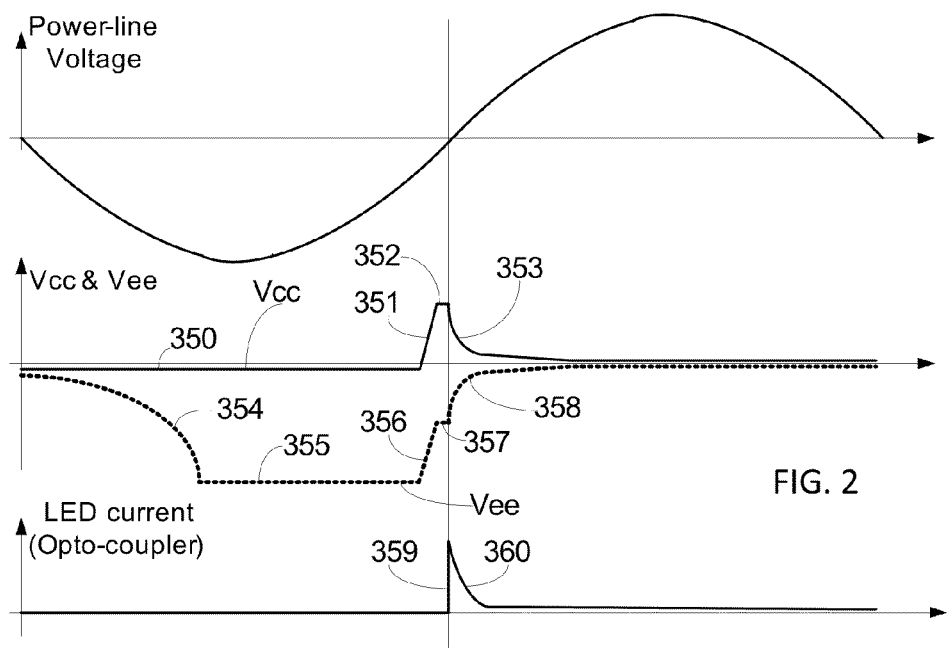
FIG. 2 is a graph showing signal waveforms in the zero-crossing detector of FIG. 1, in accordance with an embodiment of the present invention.

FIG. 2 is a graph showing signal waveforms in the zero-crossing detector of FIG. 1, in accordance with an embodiment of the present invention. The top plot in FIG. 2 shows one cycle of the input AC waveform, e.g., voltage 200. The middle plot in FIG. 2 shows the rails voltages Vcc (solid curve) and Vee (dashed curve) during the cycle. The bottom plot shows the current through the LED of opto-coupler 211, i.e., the zero-crossing detection.

During most of the negative half-cycle of voltage 200, Vcc is set to −0.6V. This time period is marked 350 in the figure. During period 350, the capacitor in short-term power supply 205 is charged. Vee is charged during a section 354 of the waveform. During section 355, Vee is constant at −16V due to a Zener diode in limiter 206.

The power rails lifting function of module 203 is seen in sections 351 and 356 of the Vcc and Vee waveforms, respectively. Following these sections, module 203 activates comparator 207 using switch 208. The flat short period in which Vcc=8.2V and Vee=−7.2V is associated with sections 352 and 357 of the Vcc and Vee waveforms, respectively.

At the end of sections 352 and 357, comparator 207 detects the zero-crossing event and triggers latch 209 and opto-coupler 211. Sections 353 and 358 show the triggering of the LED in opto-coupler 211, which consumes the energy stored in the capacitor of power supply 205. Both Vcc and Vee drop exponentially during this period, until the capacitor is fully discharged.

On the bottom curve, the triggering point corresponding to the zero-crossing event is seen as a leading edge 359 of a short pulse produced by the opto-coupler. The LED current decays exponentially as seen in a section 360 of the LED current waveform.

Example Zero-Crossing Detector Implementation

Figure 3:
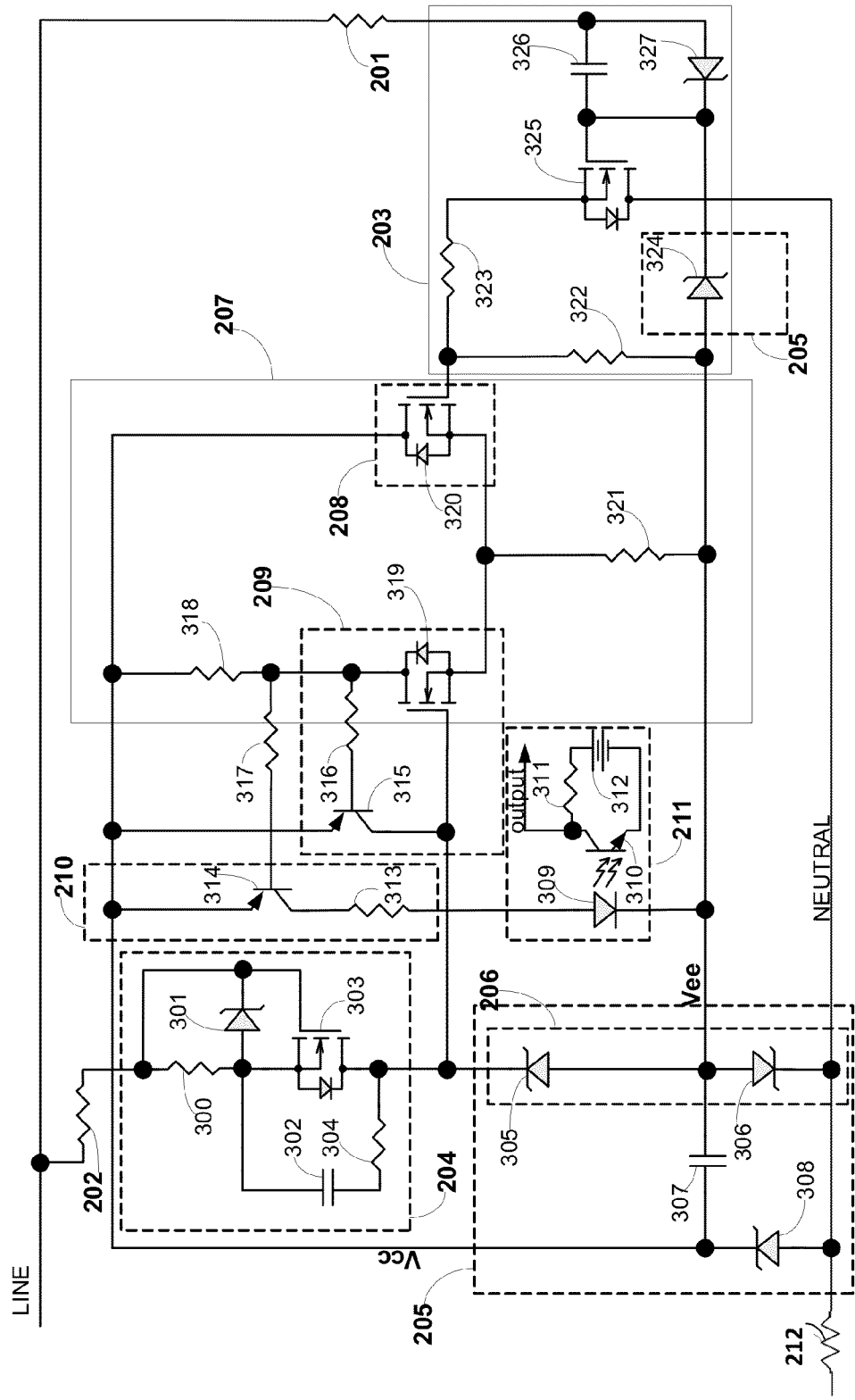
FIGS. 3-9 are circuit diagrams of zero-crossing detectors, in accordance with embodiments of the present invention.

FIG. 3 is a circuit diagram of a zero-crossing detector, in accordance with an embodiment of the present invention. The configuration of FIG. 3 comprises all the above-described mechanisms—Rails voltage lifting, amplitude variation compensation and comparator activation shortly before the zero-crossing point. Elements of FIG. 3 that perform the various functions of the block diagram of FIG. 1 are marked with dashed frames having reference numbering corresponding to the blocks of FIG. 1. (The same notation is used in FIGS. 4-9 that follow.) As can be seen in the figure, some components have multiple roles, i.e., participate in implementing multiple system functions.

Implementation of Compensation Module 204

In FIG. 3, compensation module 204 is implemented using a single Metal-Oxide Semiconductor Field-Effect transistor (MOSFET) 303 acting as both a comparator and a switch, resistors 202, 300 and 304, and a capacitor 302.

During the negative half-cycle of the mains voltage (e.g., voltage 200 of FIG. 1), FET 303 is cut-off, since the current that charges capacitor 302 flows such that the voltage drop on resistor 300 creates a negative Vgs for FET 303. In other words, the same current that charges energy storage capacitor 307 of short-term power supply 205, also charges latency compensation capacitor 302 of compensation module 204, such that the voltage on capacitor 302, referenced to the source of FET 303, is positive.

The charge accumulated in capacitor 302 is in fact the mathematical integral of the current through resistor 202, the current integrated over the negative half-cycle of voltage 200. Since an integral is a linear mathematical operator, and since at any given time the current is proportional to the instantaneous value of voltage 200, it follows that the integral of the accumulated instantaneous current over the negative half-cycle is linearly proportional to the amplitude of voltage 200. The proportion coefficient K between the two is proportional to 1/Capacitor_302. Thus, smaller capacitances of capacitor 302 correspond to larger K.

In proximity to the zero-crossing point, capacitor 302 acts like a voltage source whose voltage has been automatically adjusted by the integral of the current that is also used to charge energy storage capacitor 307. This "automatically adjusted voltage source" (capacitor 302) should be readjusted during the negative half-cycles of the input AC waveform (voltage 200), and during these periods only.

For this purpose, capacitor 302 should be fully discharged during the positive half-cycles. Note that during the positive half-cycle, the voltage on resistor 300 is such that Vgs of FET 303 is positive and hence the FET is in conductive mode. Note also that during the positive half-cycle, the voltage Vds across FET 303 is negative. FET 303 conducts current in the reverse direction (from source to drain) and discharges capacitor 302 through resistor 304. This feature ensures that capacitor 302 is completely discharged at the beginning of each negative half-cycle of voltage 200.

A Zener diode 301 typically plays no functional role under normal conditions. The role of diode 301 is to protect FET 303 from high voltage surges, e.g., surges that may exceed 1000V. Zener diode 301 limits Vgs of FET 303 to within −0.6V and +Vzener, such that the FET is protected.

Implementation of Short-Term Power Supply 205

Short-term energy storage & power supply 205 in the detector of FIG. 3 is implemented using Zener diodes 308, 306, 305 and 324, and capacitor 307 that serves as the energy storing device. Note that Zener diodes 305, 306 and 324 play additional roles and are thus also part of other blocks.

During the negative half-cycle of voltage 200, energy storage capacitor 307 is charged. Charging current flows through the serial chain comprising resistor 202, resistor 300, compensation capacitor 302, resistor 304, Zener diode 305 (in forward mode), energy storage capacitor 307 and Zener diode 308 (in forward mode).

Another contribution to the charging current is due to current that flows through the series chain of resistor 201, capacitor 326 and/or Zener diode 327 (in Zener mode), Zener diode 324 (in forward mode), energy storage capacitor 307 and Zener diode 308 (in forward mode). The current from both paths charges capacitor 307, reaching a voltage of −16V at Vee and −0.6 at Vcc. (This process applies to the embodiments of FIGS. 4-9, as well.) Zener diode 306 limits Vee to −16V, while Zener diode 308 limits Vcc to −0.6V.

When voltage 200 is still negative but approaching zero, a process leading to the zero-crossing detection is initiated. The process is described in detail further below. As part of this process, power rails lifter 203 drives current through resistors 322 and 323. In this manner, rails lifter 203 increases voltage Vee on the right hand side of capacitor 307. Consequently, voltage Vcc on the left hand side of capacitor 307 is also increased.

The rails voltage lifting process stops when the voltage at Vcc approaches the Zener voltage of diode 308. At this point (corresponding to periods 352 and 357 of FIG. 2) Vcc equals +8.2V and Vee equals −7.2V, in the present example. Vcc and Vee are used for driving comparator block 207, latch block 209 and driver block 210.

Implementation of Limiter 206

In the embodiment of FIG. 3, limiter 206 is implemented using Zener diodes 305 and 306. Note that these Zener diodes are also part of short-term power supply 205. In this embodiment, the voltage Vgs of a FET 319 (to be described below) should not exceed some absolute maximum ratings defined by the FET manufacturer. In the FETs used in the disclosed embodiments, for example, the maximum allowed Vgs is +/−20V.

The voltage at the gate of FET 319, relative to NEUTRAL, is bounded by −16.6V during the negative half-cycle of voltage 200, since Zener diode 305 drops 0.6V (in forward mode) and Zener diode 306 drops 16V (in Zener mode). During the positive half-cycle of voltage 200, the voltage at the gate of FET 319 relative to NEUTRAL is bounded by +16.6V, since Zener diode 305 drops 16V (in Zener mode) and Zener diode 306 drops 0.6V (in forward mode).

Implementation of Power Rails Lifter & Comparator Power Control Module 203

Power rails lifter 203 in FIG. 3 is implemented using Zener diodes 324 and 327, capacitor 326, FET 325, and resistors 322 and 323. During the negative half-cycle of voltage 200, current flows through the series chain comprising resistor 201, capacitor 326, Zener diode 324, capacitor 307 and Zener diode 327 (in forward mode). See also the description relating to short-term power supply 205. This current charges capacitor 326 until reaching the Zener voltage of Zener diode 327.

While the instantaneous value of voltage 200 is still negative but approaching zero, the voltage at the gate of FET 325 is substantially the instantaneous value of voltage 200 plus the Zener voltage of diode 327. The reason is that at this point in time, Zener diode 324 is cut-off and there should be no voltage drop on resistor 201. In practice, however, there is some voltage drop due to the gate capacitance of the FET 325.

The voltage at the gate of FET 325 is ahead of the instantaneous value of voltage 200. Thus, when voltage 200 is negative but approaching zero, a series of events is implemented in sequential order. These events comprise, among others, rails voltage lifting, activation of comparator 207, and setting of the comparator reference voltages (in this order).

Power rails lifting is implemented by gradually injecting current from the NEUTRAL line, through FET 325 and resistors 323 and 322. Then, FET 320 enters its conductive mode. Further rail lifting is due to source current of FET 320 through resistor 321. This stage is referred to as comparator activation, since FET 320 is part of the comparator. Switch 208 of FIG. 1 is actually implemented using the same FET 320, which is also part of comparator 207 itself.

Finally, FET 325 is saturated, exhibiting a resistance of several Ohms. If resistor 323 is of zero Ohms, the reference voltage applied to FET 320 of the comparator is zero. Otherwise, an optional offset voltage can be set, depending on resistors 322 and 323.

Implementation of Comparator Activation Switch 208

Comparator activation switch 208 is one of two roles played by FET 320. Comparator 207, whose two major components are FETs 319 and 320, is activated by applying a positive reference voltage to the gate of FET 320 with respect to Vee. In the present embodiment there is no physical distinct component that fulfills the role of switch 208. The switch appears as distinct component in the block diagram of FIG. 1 for purpose of explanation only.

Implementation of Comparator 207

In the embodiment of FIG. 3, comparator block 207 is implemented using a differential amplifier comprising FETs 319 and 320 and resistors 318 and 321. As explained above, shortly before the anticipated zero-crossing point, comparator 207 is provided with the environmental requirements for proper zero-crossing comparison. These requirements include Vcc=+8.2V, Vee=−7.2V, and a reference voltage that is either zero or a small negative voltage.

When the voltage at the gate of FET 319 is slightly higher than the reference voltage at the gate of FET 320, a current steering effect occurs. The current through resistor 321 is steered to flow through FET 319 rather than through FET 320. As a result, a voltage of approximately 7V is dropped across drain resistor 318, indicating a zero-crossing event.

Implementation of Latch 209

Latch 209 in FIG. 3 is implemented using FET 319, and a bi-polar transistor 315 in conjunction with resistor 316. FET 319, too, plays multiple roles. Before the zero-crossing event, FET 319 is part of comparator (differential amplifier) 207. A fraction of a second after the zero-crossing event, the FET 319 begins to play the role of a latch in conjunction with bi-polar transistor 315 and resistor 316.

Once FET 319 is in conductive state, base current flows through transistor 315. Due the transistor Hfe, a significantly larger current flows through its collector, which in turn raises the gate voltage of FET 319 abruptly. This positive feedback scheme makes the pair of transistors 315 and 319 act like a latch. Note that if Vcc and Vee would have been applied indefinitely, there would be no way to unlatch the transistor pair. However, since the energy stored in capacitor 307 of short-term power supply 205 is fully consumed within few tens of microseconds following a zero-crossing event, the latch is released shortly after zero-crossing events. The purpose of the latch is to provide a sharp definitive current step for a LED 309 in opto-coupler 211.

Implementation of Driver 210

In the present embodiment, current driver 210 is implemented using a bi-polar transistor 314 and a resistor 313. The purpose of current driver 210 is to drive LED 309 of opto-coupler device 211. A sharp current step that carries a relatively high current is desirable to reduce the opto-coupler response time.

Once latch 209 is latched, current flows into the base of transistor 314 through resistor 317. Consequently, transistor 314 drives current into LED 309, and the secondary side of the opto-coupler, typically fed from a floating power source 312, indicates a zero-crossing event.

Implementation of Opto-Coupler 211

In the disclosed embodiments, opto-coupler 211 is typically implemented using a standard off-the-shelf device. In conjunction with resistor 311 and (typically) floating power supply 312, the opto-coupler conveys the zero-crossing events to the floating power supply domain, free of galvanic connection to voltage 200.

Alternative Zero-Crossing Detector Implementations

Figure 4:
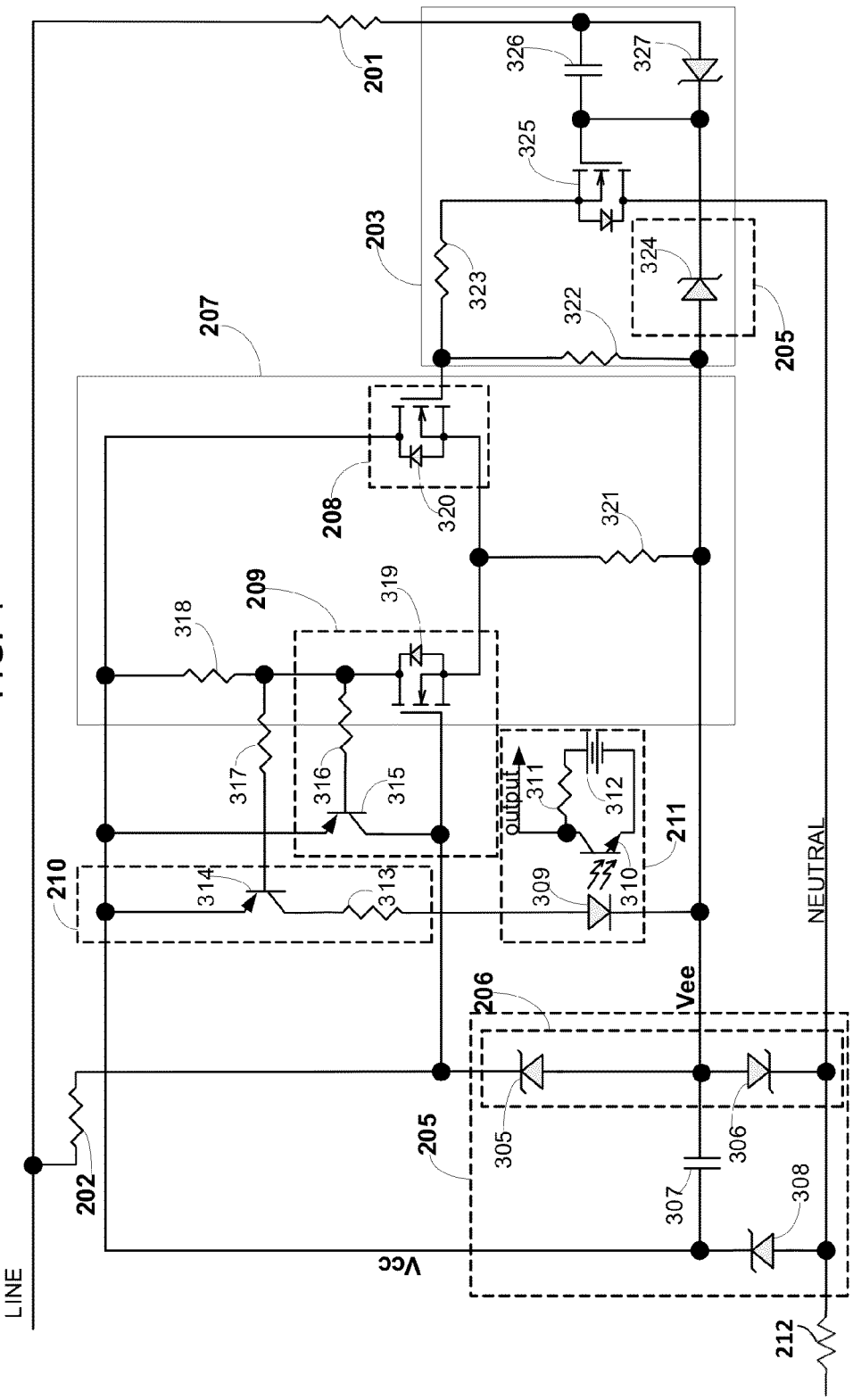

FIG. 4 is a circuit diagram of a zero-crossing detector, in accordance with an alternative embodiment of the present invention. In this embodiment, compensation module 204 is omitted, relative to the implementation of FIG. 3 above. Thus, the embodiment of FIG. 4 does not compensate for the delay variations caused by different amplitudes of the input AC waveform (mains voltage 200). Such an implementation may be chosen, for example, when zero-crossing accuracy and/or power consumption are not prime considerations, and can be traded for smaller bill of materials and/or smaller footprint.

In the present embodiment, there is some trade-off between timing accuracy and power consumption. When power consumption can be compromised, a lower resistance can be used for resistor 202, thus decreasing the susceptibility of the detector to AC waveform amplitude variations. For example, when compatibility to both 110 VAC and 220 VAC networks is not mandatory, a reasonable compromise can be made between performance and power consumption.

Figure 5:
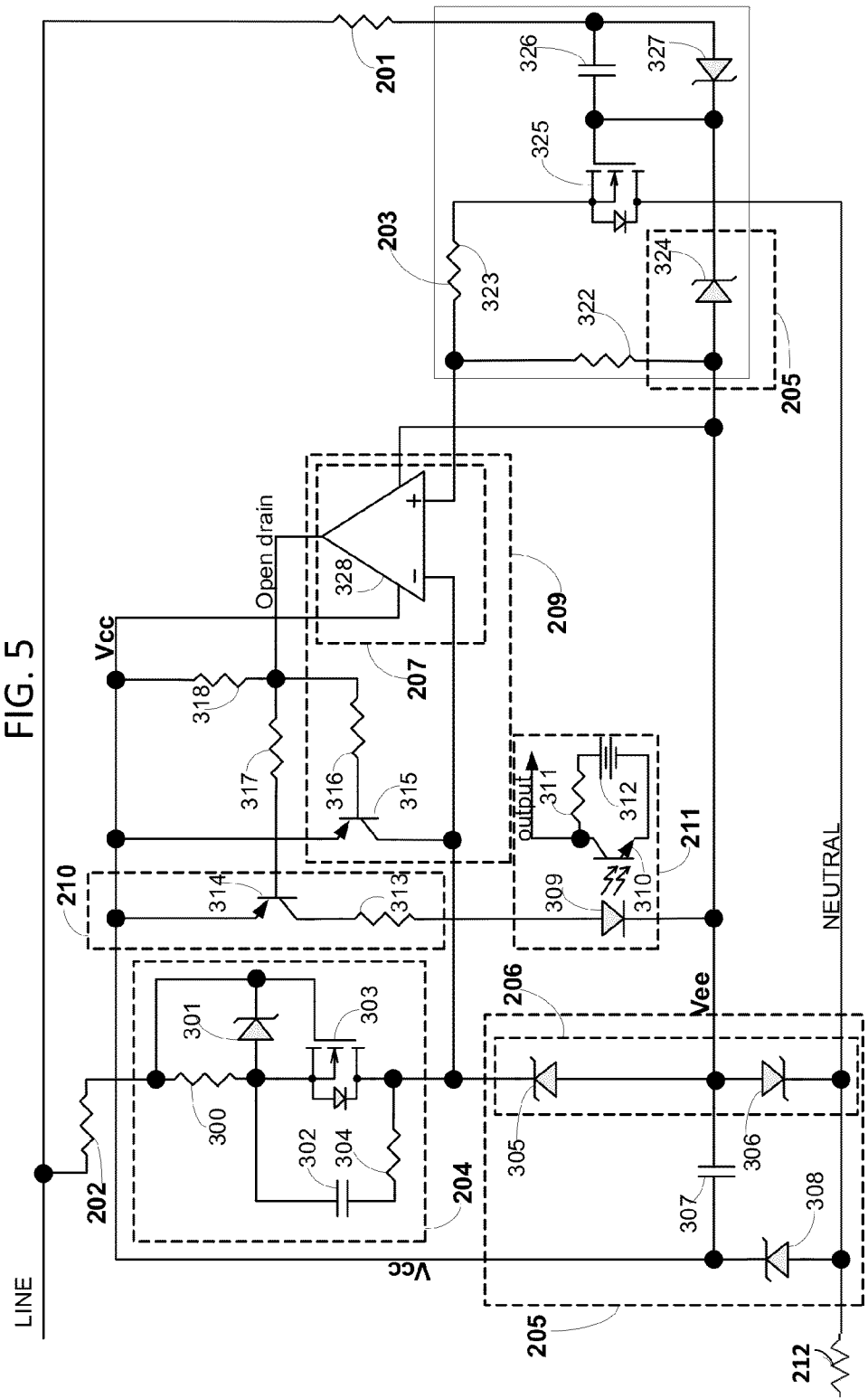

FIG. 5 is a circuit diagram of a zero-crossing detector, in accordance with another embodiment of the present invention. The implementation of FIG. 5 is similar to the implementation of FIG. 3 above, in the sense that it includes all the building blocks of FIG. 1. In FIG. 5, however, comparator block 207 is implemented using an off-the-shelf comparator chip 328. In this embodiment, the comparator features an open-drain (or open-collector) output.

In the present example, chip 328 plays a dual role. Before the zero-crossing event, chip 328 serves as a comparator. Immediately after the zero-crossing event, chip 328 serves as part of latch 209 that includes transistor 315 and resistor 316.

Figure 6:
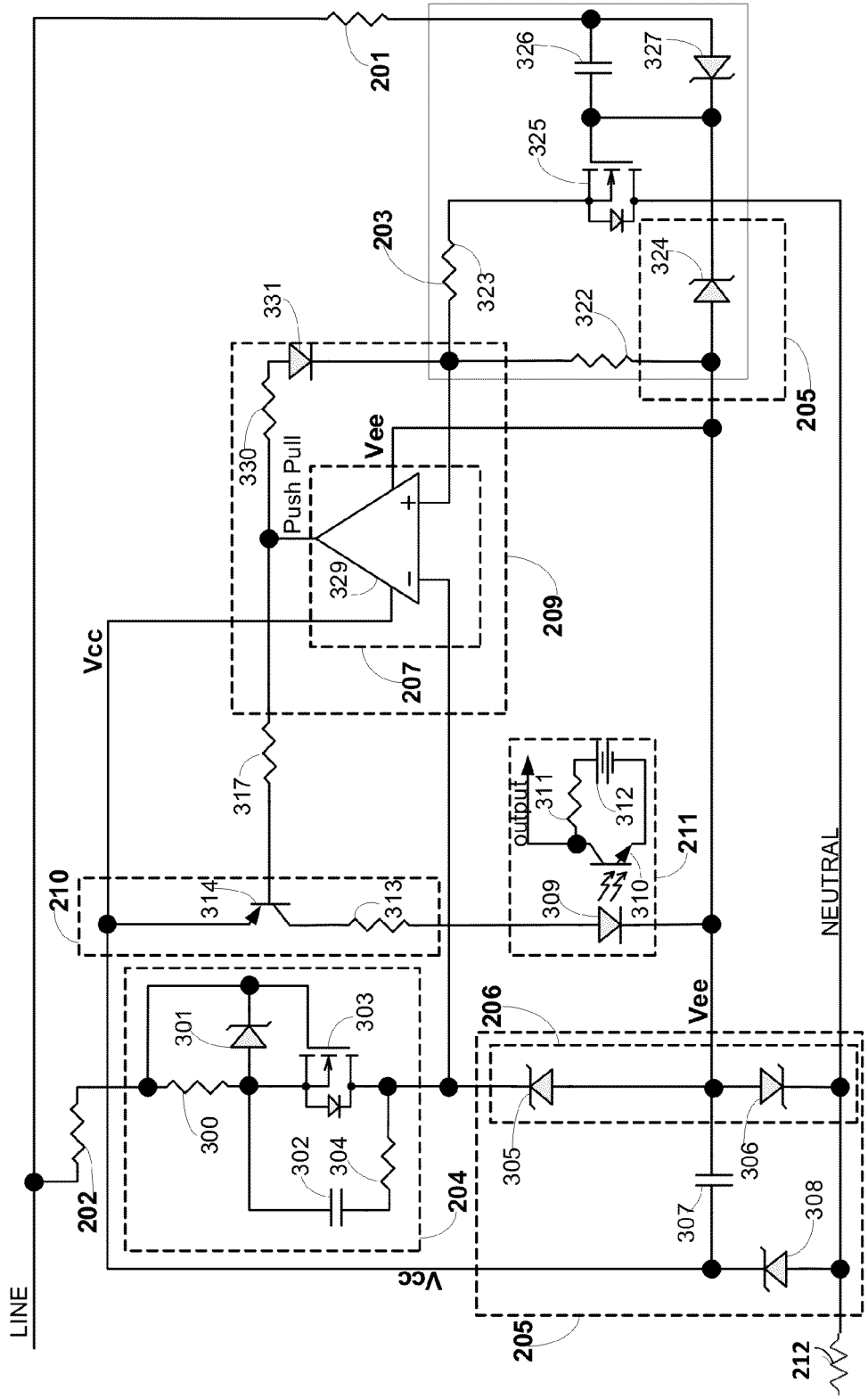

FIG. 6 is a circuit diagram of a zero-crossing detector, in accordance with yet another embodiment of the present invention. Like FIG. 5, the implementation of FIG. 6 also comprises all the building blocks of FIG. 1. The differences between the present implementation and that of FIG. 5 are in the latch block and in the type of comparator. The detector of FIG. 6 comprises a comparator chip 329 having a push-pull output stage.

Instead of transistor 315 and resistor 316 of FIG. 5, the present example comprises a resistor 330 and a diode 331. Comparator 329 of FIG. 6 plays a dual role as both a comparator and part of a latch. Immediately after the zero-crossing event, the positive feedback through resistor 330 and diode 331 causes comparator 329 to act as a latch.

Figure 7:
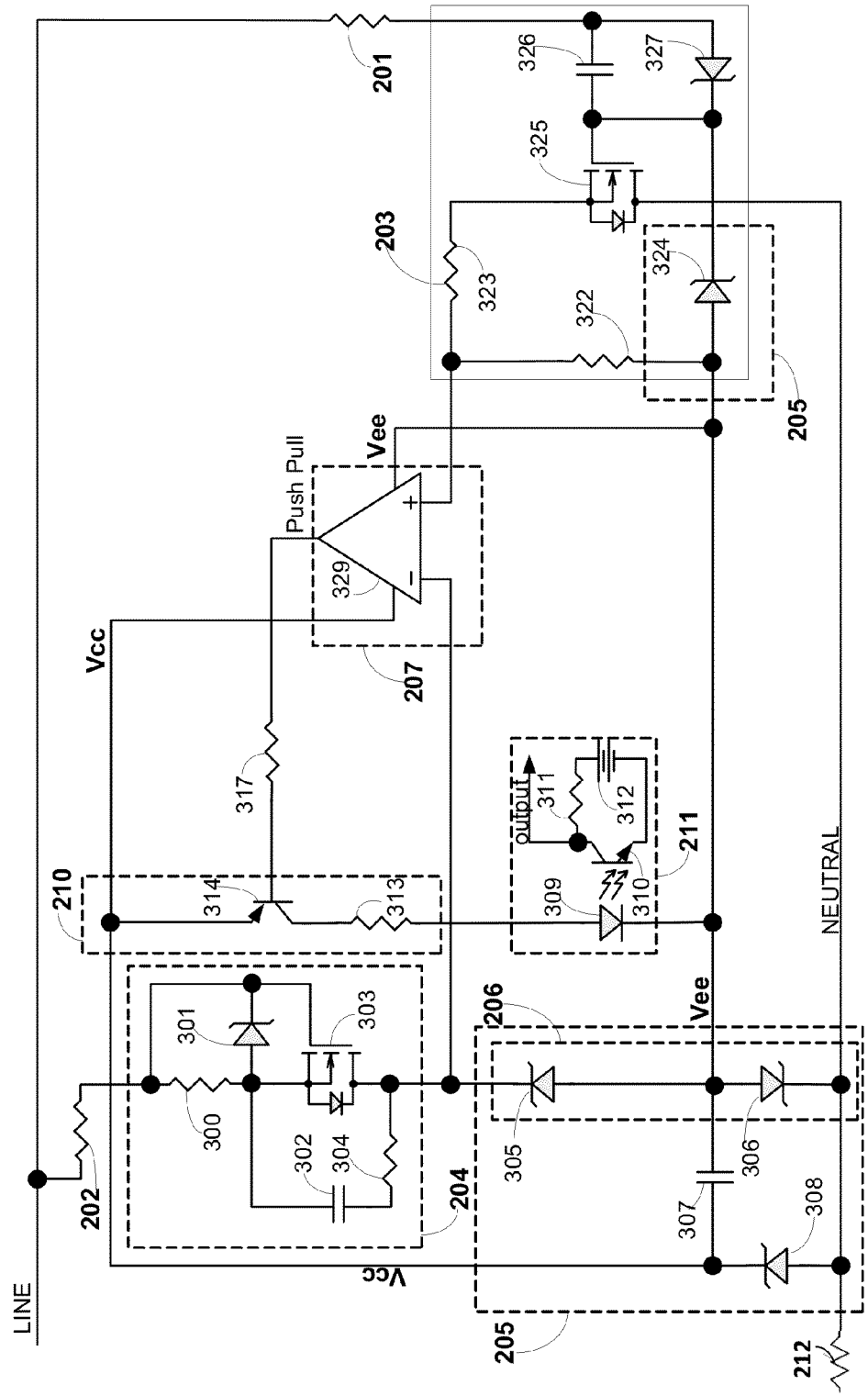

FIG. 7 is a circuit diagram of a zero-crossing detector, in accordance with another embodiment of the present invention. This implementation is similar to that of FIG. 6 above, excluding the latch. By nature, some off-the-shelf comparators feature high gain and as such provide a sharp step response to level crossing. In discrete implementations such as in FIG. 1, comparator 207 alone does not feature a very high gain. High gain is achieved, however, with the positive feedback being part of a latch. Latch-free embodiments can be considered, for example, when noise is not a prime consideration.

Figure 8:
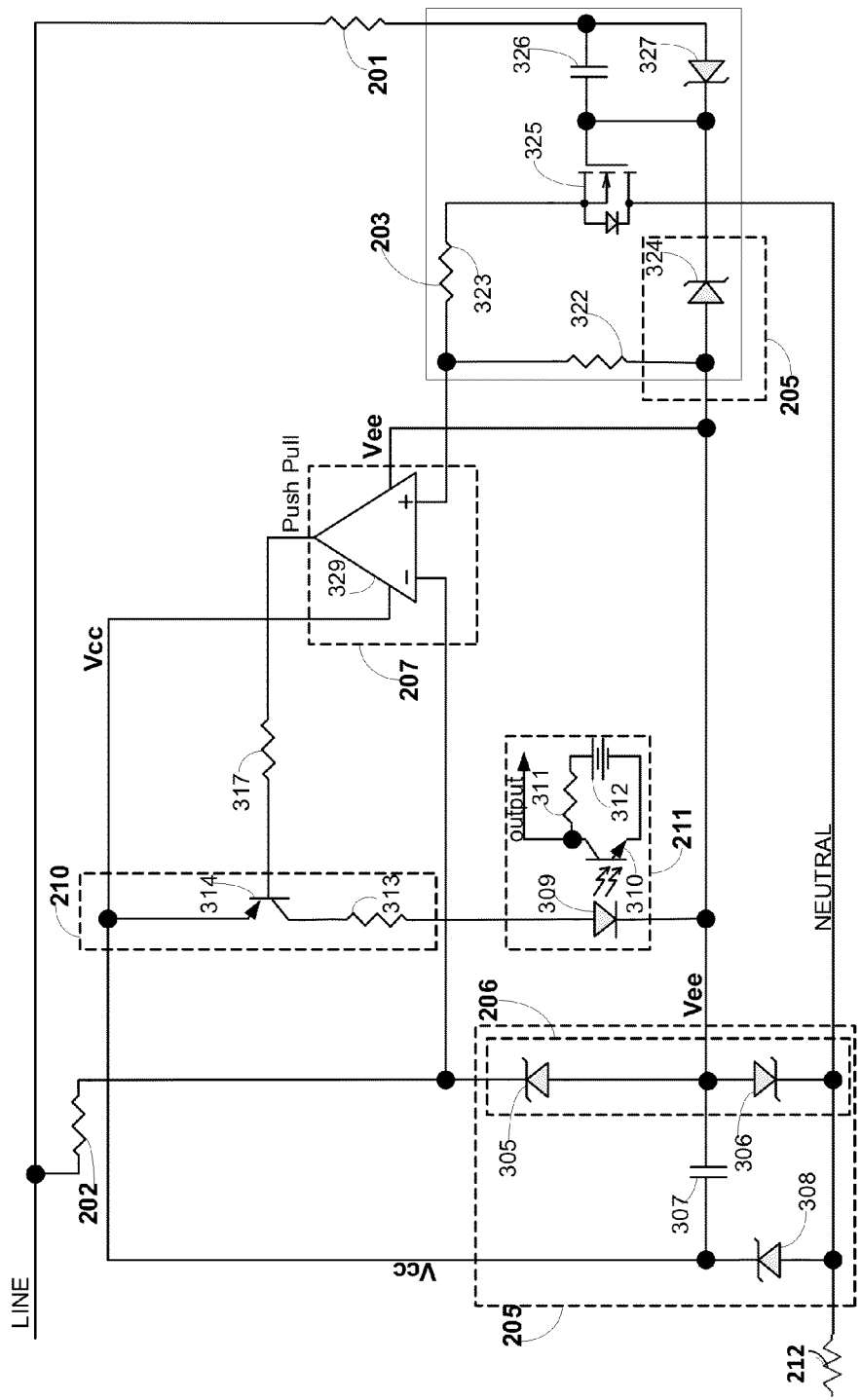

FIG. 8 is a circuit diagram of a zero-crossing detector, in accordance with another alternative embodiment of the present invention. The present implementation is similar to that of FIG. 7 above, excluding compensation module 204. As noted above, when bill of materials and/or footprint are the top priorities, compensation module 204 may be removed at the expense of zero-detection accuracy and/or power consumption. Zero-crossing detection accuracy and power consumption can be traded-off by proper choice of resistance for resistor 202, as explained above with respect to FIG. 4.

Figure 9:
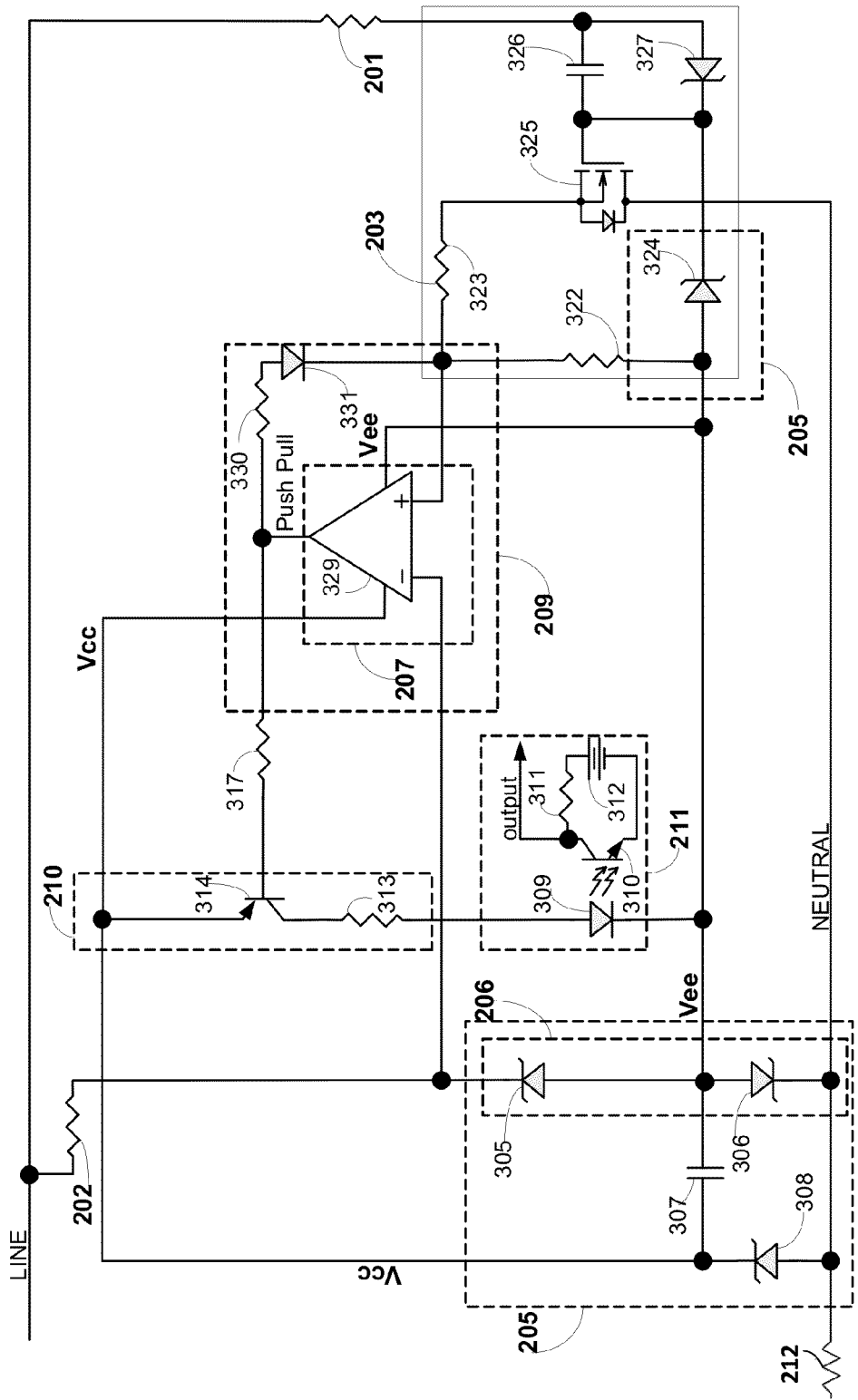

FIG. 9 is a circuit diagram of a zero-crossing detector, in accordance with yet another embodiment of the present invention. This implementation is similar to that of FIG. 8 above, except for re-inclusion of the latch element, by adding resistor 330 and diode 331.

Example Zero-Crossing Detector Performance

FIG. 10 is a graph showing step-by-step performance of the zero-crossing detector of FIG. 3, in accordance with an embodiment of the present invention. The figure shows the voltage waveforms at the gate of FET 319, at the gate of FET 320 and the power line voltage (voltage 200), in the vicinity of a zero-crossing event. The zero-crossing event is shown in the middle of the figure. The horizontal scale is 100 μS/square, and the vertical scale is 5 V/square.

The description that follows describes the sequence of events relating to zero-crossing detection in the detector of FIG. 3 above. (Steps 1A-1E are described in the text only, and the figure focuses on subsequent steps 2-7.) Each step is defined in terms of the instantaneous mains voltage range (range of voltage 200 in FIG. 3). For example, the instantaneous voltage range from −22.8V to −14V corresponds to a step, the voltage range from −14V to −12.6V corresponds to the next step, and so on.

Before detailing the sequence of steps, consider the signal "FET 319 gate" during the last 100 μS prior to the zero-crossing event. The slope (dv/dt) of this signal is visibly lower than the slope of the power-line voltage. However, the voltage at "FET 319 gate" is clearly higher than that of the power-line, prior to the zero-crossing event, because of compensation module 204. Thus, the zero-crossing timing is corrected and occurs exactly on time. Note also how the reference voltage at "FET 320 gate" gradually converges to zero before the actual comparison.

Step #1A—Negative Half-Cycle

In this step, energy storage capacitor 307 is charged.

Step #1B—The Negative Half-Cycle Until Voltage 200 Approaches −22.8V

The time interval of step #1B overlaps the time interval of step #1A. Since Zener diode 305 is in conducting forward current state in order to charge the energy storage capacitor, the voltage drop across diode 305 is approximately 0.6V. Thus, Vgs of FET 319 is −0.6V. Consequently, FET 319 is cut-off. Since FET 319 is cut-off, there is no voltage drop on resistor 318, and therefore bi-polar transistors 314 and 315 are also cut-off.

This situation, in conjunction with the operation of FET 320 that is described in the following section, ensures that no current is drawn from the energy storage capacitor during the negative half-cycle of the input AC waveform (voltage 200), until the momentary value of voltage 200 approaches −22.8V.

Step #1C—The Negative Half-Cycle Until Voltage 200 Approaches −22.8V

The time interval of step #1C overlaps the time interval of step #1A, and fully overlaps the time interval of step #1B. During step #1C, Vgs of FET 325 is −0.6V, because part of the charging current of energy storage capacitor 307 flows forward through Zener diode 324, while Vgs is exactly the voltage across that diode. This operation ensures that no current flows through FET 325, and thus no current flows through resistors 323 and 322, and no voltage is dropped across these resistors. Consequently, Vgs of FET 320 is zero, thus it is also cut-off. Again, this operation ensures that the limited amount of energy stored in energy storage capacitor 307 is not consumed before it is needed.

Step #1D—The Negative Half-Cycle Until Voltage 200 Approaches −22.8V

The time interval of step #1D overlaps the time intervals of steps #1B and #1C. As part of a suitable timing mechanism, capacitor 326 is charged to 8.2V, limited by Zener diode 327. The current used for charging capacitor 326 also contributes to the charging of capacitor 307, until the voltage on capacitor 326 reaches 8.2V. At this point, current keeps flowing through diode 327 in Zener mode, contributing to the charge current of capacitor 307.

Since the slope of voltage 200 is relatively low, (e.g., on the order of 0.1V/μS at its highest points for a 220 VAC network), generating a signal that is 8.2V ahead of voltage 200 on its rising portion, is used to create scheduled events. While voltage 200 is still negative, the voltage at the cathode of diode 327 is 8.2V ahead of the instantaneous value of voltage 200. This voltage is used for triggering events such as power rails lifting (both Vcc and Vee are lifted by 8.8V), and FET 325 is gradually transferred to conductive mode. This feature is further explained in the next steps.

Step #1E: The Negative Half-Cycle Until Voltage 200 Approaches −24.8V

The time interval of step #1E fully overlaps step #1A through step #1D. As voltage 200 reaches −24.8V, diode 324 stops conducting (forward current) and the contribution to the charging current of capacitor 307 through this path is stopped. The voltage −24.8V is due to 16V of diode 306 (in Zener mode), 0.6V of diode 324 (in forward mode) and 8.2V of diode 327 (in Zener Mode).

Step #2—Voltage 200 Rises from −22.8V to −14V

Since capacitor 326 is charged to 8.2V during the negative portion, at the end of the negative portion, as voltage 200 approaches zero, the voltage at the gate of FET 325 (relative to the NEUTRAL line) is the momentary value of voltage 200 plus 8.2V. In particular, when voltage 200 approaches −22.8V at the end of the negative half-cycle, Vgs of FET 325 reaches +1.4V, which is approximately its threshold voltage.

This operation is due to the following facts:

When voltage 200 is −22.8V, charging current still flows through diode 305 (in forward current), forcing −16V (relative to NEUTRAL) at the anode of diode 305. FETs 319 and 320 are still cut-off at this time, and therefore no voltage is dropped on resistor 321. Thus, the voltage on the source of FET 320 is −16V.

Similarly, since FET 325 is still cut-off at this point, there is no voltage drop on resistor 322, and therefore the voltage at the source of FET 325 is also −16V.

The voltage at the gate of FET 325 is the momentary value of voltage 200 plus 8.2V (of capacitor 326). When voltage 200 is −22.8V, the voltage at the gate of FET 325 is −22.8V+8.2V=−14.6V.

The voltage between the gate and the source of FET 325 is −14.6V−(−16V)=1.4V. At this point the voltage at the drain of FET 325 is 0V (NEUTRAL), and thus FET 325 is at its conducting threshold. Voltage 200 keeps rising from −22.8V to −14V (an increase of 8.8V). During this period, diode 305 keeps conducting (in forward mode), and the voltage at the anode of diode 305 rises by 8.8V, from −16V to −7.2V, while the voltage at the cathode of diode 308 rises from −0.6V to +8.2V.

The above holds due to the following facts:

As the voltage on the gate of FET 325 rises, the source of FET 325 follows.

The resistance of resistor 322 is much lower than the resistance of resistor 300, and therefore the voltage at the anode of diode 305 rises.

As the voltage on the anode of diode 305 rises, the voltage at the cathode of diode 306 also rises, since capacitor 307 is charged to 15.4V at this time.

Since the voltage on the gate and the source of FET 320 rises at the same pace (the voltage on resistor 322 is nearly zero), FET 320 remains cut-off during this time interval (of step #2).

Since the voltage at the cathode of diode 305 is more negative than the voltage on its anode, forward current flows through diode 305 during the entire interval. As such, the voltage across diode 305 is 0.6V and Vgs of FET 319 is −0.6V, which keeps FET 319 cut-off during this time interval, saving the energy stored in capacitor 307.

At the point where the momentary value of voltage 200 reaches −14V, the voltage at the gate of FET 325 is −14V+8.2V=−5.8V. The voltage at the source of FET 325 is approximately 1.4V lower, yielding −7.2V.

Since the voltage on the right-hand-side of capacitor 307 (Vee) is −7.2V, and since capacitor 307 is charged to 15.4V, the voltage on its left-hand-side (Vcc) is −7.2V+15.4V=8.2V, which is precisely the Zener voltage of diode 308.

To conclude, at the end of this time interval:

The voltage on the left-hand-side of capacitor 307 (Vcc) is 8.2V.

The voltage on the right-hand-side of capacitor 307 (Vee) is −7.2V.

FET 325 is at its threshold of conducting mode (Vds=0−(−7.2))=7.2V. Vgs is 1.4V.

FETs 319 and 320 and transistors 314 and 315 are all cut-off, preserving the energy stored in capacitor 307.

Step #3—Voltage 200 Rises from −14V to −12.6V

As voltage 200 reaches −14V, the voltage at the cathode of diode 305 can no longer rise, at least not rapidly, because Zener diode 308 is in conductive state (Zener mode) and limits the voltage on the left-hand-side of capacitor 307 (Vcc) to +8.2V. Consequently, the voltage on its right-hand-side (Vee) cannot rise above −7.2V unless capacitor 307 is discharged.

At this point, resistor 322 can no longer keep a near zero voltage across it because its resistance is too large. The τ factor of resistor 322 in conjunction with capacitor 307 is much too large compared with the slope (dV/dt) of the rising voltage 200.

As a result, the voltage on resistor 322 rises. When voltage 200 reaches −12.6V, the voltage at the gate of FET 325 is −12.6V+8.2V=−4.4V. The voltage at the source of FET 325 is −4.4V−1.4V=−5.8V. Resistor 323 is normally small compared to resistor 322, and therefore the voltage at the gate of FET 320 is approximately −6.2V. This value is in proximity to the conductive threshold of FET 320.

The current through resistor 321 is still zero, and so is the voltage across this resistor. Therefore, the voltage at the source of FET 320 equals the voltage at the anode of diode 305, namely −7.2V. As a result, Vgs of FET 320 is −6.2V−(−7.2V)=1V, which is in proximity to the FET Vgs threshold.

To conclude, at the end of step #3:

FET 325 is in conducting mode and the voltage across it is Vds=0−(−5.8V)=5.8V.

FET 320 is in proximity to its conductive threshold.

The voltages on the left-hand-side and right-hand-side of capacitor 307 (Vcc and Vee) are 8.2V and −7.2V, respectively.

A small portion of the energy stored in capacitor 307 is consumed.

Step #4: Voltage 200 Rises from −12.6V to −6.8V

As voltage 200 rises above −12.6V, the voltage at the source of FET 325 keeps rising, following the voltage at its gate. This relation is true until the voltage at the gate of FET 325 rises above 1.4V with respect to NEUTRAL, namely when the momentary value of voltage 200 is −6.8V (since −6.8V+8.2V=+1.4V). (−6.8V is the instantaneous value of voltage 200, and +8.2V is the voltage across capacitor 326).

During this interval of rising from −12.6 to −6.8V, the voltage at the gate of FET 320 rises from −6.2V to 0V. (In practice, there is usually some latency hence this ramping process proceeds to step #6). At the point where voltage 200 reaches −6.8V, FET 325 is no longer in active conductive mode, but rather in saturated conducting mode, in which the voltage across the FET (Vds) is zero.

In some embodiments in which resistor 323=0Ω, the voltage at the gate of FET 320 is zero. Note that FET 320 is part of a differential amplifier (comparator) implemented using FET 319 and FET 320, and that zero voltage is used as a reference voltage to which the instantaneous value of voltage 200 is compared. (The role of resistor 323 is to provide a constant offset, typically to compensate for the constant delay of an opto-coupler).

To conclude, at the end of this step:
FET 325 should be saturated and the voltage across it should be zero (in practice there is often some latency).
The voltage at the gate of FET 320 is zero (or a small constant offset voltage, depending on resistor 323), which is the reference voltage for zero crossing.
The voltages on the left-hand-side and right-hand-side of capacitor 307 are nearly 8.2V and −7.2, respectively, except for a small voltage decrease due to current that flows through FET 320. These voltages (Vcc and Vee) allow the differential amplifier to function and compare voltage 200 with the desired threshold.
Part of the energy stored in capacitor 307 is consumed in order to activate the differential amplifier (comparator).

Step #5—Voltage 200 Rises Above −7.8V

This event takes place in the middle of the time interval of step #4. As voltage 200 reaches −7.8V, diode 305 stops conducting (forward current) and the contribution to the charging current of capacitor 307 through this path is stopped. The −7.8V value is due to the −7.2V at Vee (with respect to NEUTRAL), minus 0.6V dropped on diode 305 (forward mode).

Step #6—Voltage 200 Rises from −6.8V to Zero

During this interval, the voltage at the gate of FET 325 keeps rising with respect to NEUTRAL until it reaches 6.8V (0V+6.8V). This operation does not affect FET 325, which is already saturated, exhibiting only few Ohms, forcing a zero voltage (or a small constant offset, depending on resistor 323) at the gate of FET 320. The charging current through diode 305 and resistor 202 stops when the momentary value of voltage 200 reaches −7.8V (as explained in step #5).

Under ideal conditions, at this point the current through resistor 202 would be zero, and hence the voltage drop across it would be zero. In practice, however, the input capacitance of FET 319 acts as a capacitive load, causing the momentary voltage at the gate of FET 319 to lag after voltage 200. This issue was addressed and explained above with respect to compensation module 204.

From the point in which voltage 200 rises above −7.8V, the voltage at the gate of FET 319 is the same as voltage 200, provided that compensation capacitor 302 is properly tuned. When the voltage at the gate of FET 319 reaches the reference point, a zero-crossing indication is produced. Comparator 207 is activated some 100-200 μS prior to the zero-crossing event.

Step #7—The Positive Half-Cycle

At the beginning of this time interval, the zero-crossing indication is completed. The circuit should be protected from high values of voltage 200, so as to prevent damage to components. Typically, the voltage between the gate of FET 319 and the NEUTRAL wire should not exceed 16V, because of Zener diode 305 that limits the voltage in order to protect FET 319.

When diode 305 is in Zener mode, the current that flows through it also flows through diode 306 (forward current). In this case, diode 306 limits the voltage on the anode of diode 305 to approximately 0.6V.

Similarly, Zener diode 324 limits the gate-source voltage of FET 325 to 16V. As a result, the gate-to-source voltage Vgs of FET 320 is limited to approximately 14.6V, 1.4V lower than 16V due to the threshold voltage of FET 325.

FIG. 11 is a graph showing step-by-step performance of the zero-crossing detector of FIG. 3, in accordance with an embodiment of the present invention. This figure is similar to FIG. 10 above, with the addition of showing the gate voltage of FET 325.

As can be seen in the figure, until approximately 40 μS after the zero-crossing event, the gate voltage of FET 325 is higher than the power-line voltage (voltage 200). As explained above, this signal schedules several events that occur in preparation for the anticipated zero-crossing. Finally, note that the voltage at the gate of FET 319 rises abruptly at the zero crossing point. This feature is due to the latch effect. As mentioned above, FET 319 plays a dual role, being part of a positive feedback latch.

Example Power-Line Communication Application

Figure 12:
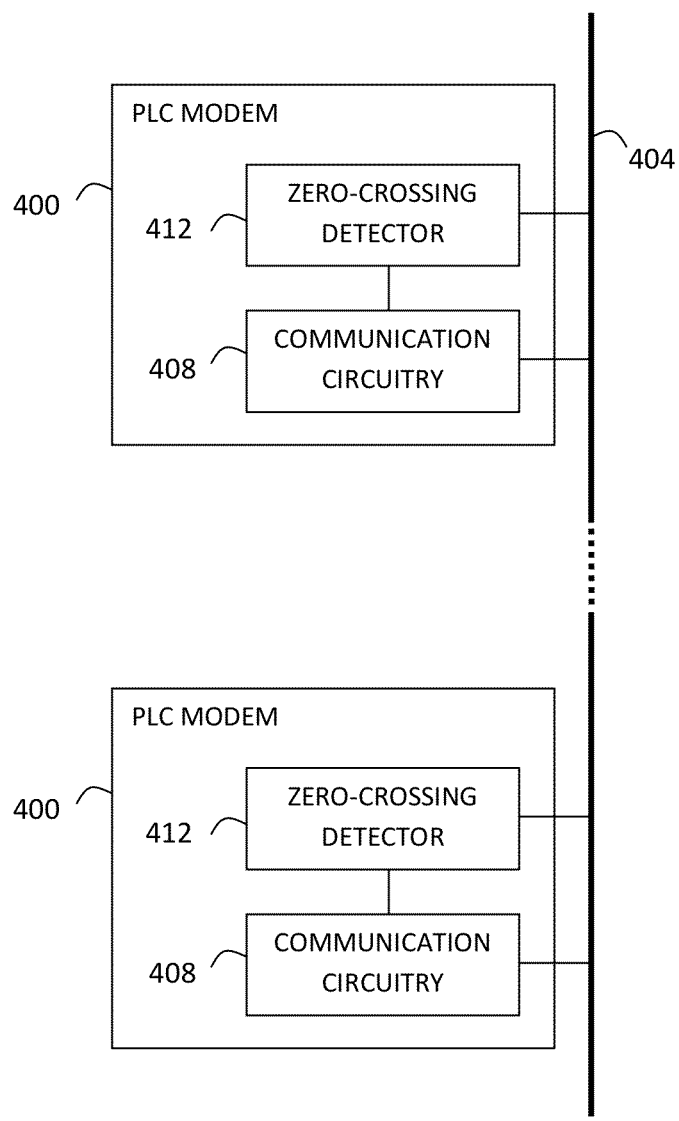
FIG. 12 is a block diagram that schematically illustrates a Power-Line Communication (PLC) system, in accordance with an embodiment of the present invention.

FIG. 12 is a block diagram that schematically illustrates a Power-Line Communication (PLC) system, in accordance with an embodiment of the present invention. This figure demonstrates one of the possible applications of the disclosed zero-crossing detection schemes. The system configuration of FIG. 12 is given purely by way of example, and any other suitable configuration can be used in alternative embodiments.

In the present example, the system comprises two or more PLC modems 400 that exchange communication signals with one another over an AC power-line network 404. Network 404 may comprise, for example, a 220 VAC or 110 VAC power-line network.

Each PLC modem 400 comprises communication circuitry 408 and a zero-crossing detector 412. Communication circuitry 408 carries out the various tasks relating to communication over network 404. Zero-crossing detector 412 detects the zero-crossing points of the AC power-line voltage provided by network 404. Detector 412 may perform zero-crossing detection using any of the schemes disclosed herein. For example, detector 412 may be implemented using any of the configurations of FIGS. 1 and 3-9 above.

Detector 412 provides an output signal indicating the zero-crossing detections to circuitry 408. Circuitry 408 may utilize the zero-crossing detections of detector 412 in any suitable way. For example, the circuitry 408 may synchronize the communication signals on reception and/or on transmission to the zero-crossing events indicated by the output signal.

Although the embodiments described herein mainly address PLC modem applications, the methods and systems described herein can also be used in other applications, such as in single-phase and triple-phase motor control and Cos(φ) power factor correction.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A zero-crossing detection circuit, comprising:
   a comparator, which is configured to produce an output signal that is indicative of zero-crossing events in an input Alternating Current (AC) waveform; and
   circuitry, which is configured to feed the comparator with first and second supply rails voltages, and to progressively increase the rails voltages during time intervals set in response to cycles of the input AC waveform, so as to feed the comparator with target values of the rails voltages in a time period proximate to the zero-crossing events.

2. The circuit according to claim 1, wherein the circuitry comprises:
   a short-term power supply for producing the rails voltages; and
   a control circuit that is configured to charge the short-term power source during time periods that precede the respective time intervals, and to cause the short-term power supply to increase the rails voltages during the time intervals.

3. The circuit according to claim 2, wherein the circuitry is configured to consume energy from the short-term power supply following the zero-crossing events.

4. The circuit according to claim 1, wherein the circuitry is configured to apply the progressively-increased rails voltages to the comparator only in a time interval preceding the time period proximate to the zero-crossing events, and to remove one or more of the rails voltages from the comparator outside the proximate time period.

5. The circuit according to claim 1, wherein the circuitry comprises a compensation circuit, which is configured to compensate for timing errors in detecting the zero crossing events caused by differences in amplitude of the input AC waveform, by correcting the input AC waveform provided to the comparator.

6. The circuit according to claim 5, wherein the compensation circuit is configured to correct the input AC waveform provided to the comparator by adding to the input AC waveform a compensation voltage that is proportional to the amplitude of the input AC waveform.

7. The circuit according to claim 6, wherein the compensation circuit is configured to charge a capacitor over a negative half-cycle of the input AC waveform, and to supply the compensation voltage from the charged capacitor.

8. The circuit according to claim 1, wherein the circuitry comprises a limiter for protecting the comparator from amplitudes of the input AC waveform.

9. The circuit according to claim 1, wherein the circuitry comprises a latched opto-coupler, and wherein the comparator is configured to drive the latched opto-coupler with the output signal so as to indicate the zero-crossing events.

10. A method for zero-crossing detection, comprising:
    operating a comparator to produce an output signal that is indicative of zero-crossing events in an input Alternating Current (AC) waveform;
    feeding the comparator with first and second supply rails voltages; and
    progressively increasing the rails voltages during time intervals set in response to cycles of the input AC waveform, so as to feed the comparator with target values of the rails voltages in a time period proximate to the zero-crossing events.

11. The method according to claim 10, and further comprising compensating for timing errors in detecting the zero crossing events caused by differences in amplitude of the input AC waveform, by correcting the input AC waveform provided to the comparator.

12. A power-line communication device, comprising:
    a zero-crossing detector, comprising:
        a comparator, which is configured to produce an output signal that is indicative of zero-crossing events in an input Alternating Current (AC) waveform provided on a power-line network; and
        circuitry, which is configured to feed the comparator with first and second supply rails voltages, and to progressively increase the rails voltages during time intervals set in response to cycles of the input AC waveform, so as to feed the comparator with target values of the rails voltages in a time period proximate to the zero-crossing events; and
    communication circuitry, which is configured to exchange communication signals with a remote power line communication device over the power-line network, to receive the output signal from the zero-crossing detector, and to synchronize the communication signals using the zero-crossing events indicated by the output signal.

* * * * *